US008426121B2

(12) United States Patent
Brueck et al.

(10) Patent No.: US 8,426,121 B2
(45) Date of Patent: Apr. 23, 2013

(54) SELF-ALIGNED SPATIAL FREQUENCY DOUBLING

(75) Inventors: Steven R. J. Brueck, Albuquerque, NM (US); Andrew Frauenglass, Albuquerque, NM (US); Alexander K. Raub, Albuquerque, NM (US); Dong Li, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 13/022,740

(22) Filed: Feb. 8, 2011

(65) Prior Publication Data

US 2011/0127235 A1 Jun. 2, 2011

Related U.S. Application Data

(63) Continuation of application No. 11/849,126, filed on Aug. 31, 2007, now Pat. No. 7,906, 275.

(60) Provisional application No. 60/824,107, filed on Aug. 31, 2006.

(51) Int. Cl.
*G03F 7/26* (2006.01)

(52) U.S. Cl.
USPC .......................................... 430/323; 430/324

(58) Field of Classification Search .................. 430/311, 430/313, 323, 324
See application file for complete search history.

(56) References Cited

U.S. PATENT DOCUMENTS

| | | | | |
|---|---|---|---|---|
| 5,360,698 | A | 11/1994 | Hanrahan | |
| 5,595,941 | A * | 1/1997 | Okamoto et al. | 216/46 |
| 6,239,008 | B1 | 5/2001 | Yu et al. | |
| 2004/0029052 | A1 | 2/2004 | Park et al. | |
| 2006/0274295 | A1 | 12/2006 | Brueck et al. | |
| 2006/0292497 | A1 * | 12/2006 | Kim | 430/313 |

OTHER PUBLICATIONS

Switkes, M et al. 'Immersion Lithography at 157nm' American Vacuum Society, Nov./Dec. 2001, J. Vac. Sci. Technol. B 19(6), 2353-2356.*

* cited by examiner

*Primary Examiner* — Kathleen Duda
*Assistant Examiner* — Caleen Sullivan
(74) *Attorney, Agent, or Firm* — MH2 Technology Law Group LLP

(57) ABSTRACT

In accordance with the invention, there are methods for self-aligned spatial frequency doubling in one dimension and also in two dimension. The method for self-aligned spatial frequency doubling in one dimension can include forming a film stack over a substrate, wherein the film stack comprises a photoresist layer and forming a one-dimensional periodic first pattern having a first pitch p on the photoresist layer using an optical exposure, wherein the first pitch p is at least smaller than twice the bandpass limit for optical exposures. The method can also include forming a second pattern using the first pattern by nonlinear processing steps, wherein the second pattern has a second pitch $p_2=p/2$.

12 Claims, 11 Drawing Sheets

345
345
p/4
350
345
310

534
532
520
510

SELF-ALIGNED SPATIAL FREQUENCY DOUBLING

CROSS REFERENCE TO RELATED APPLICATION

This application is a continuation of U.S. patent application Ser. No. 11/849,126 filed on Aug. 31, 2007, which claims priority to U.S. Provisional Patent Application Ser. No. 60/824,107 filed on Aug. 31, 2006, the disclosure of which is incorporated by reference herein in its entirety.

DESCRIPTION OF THE INVENTION

1. Field of the Invention

The present invention relates to optical lithography and more particularly to methods for self-aligned spatial frequency doubling and devices formed by self-aligned spatial frequency doubling.

2. Background of the Invention

Optical lithography is a well-established technology for the production of small features on planar substrates. Optical lithography tools are the mainstay of the integrated circuit industry. The smallest feature pitch that can be produced using a standard optical lithography tool is a grating at a period of $\lambda/2NA$ where $\lambda$ is the optical wavelength (typically a 193 nm ArF excimer laser source in current advanced commercial tools) and NA is the numerical aperture of the exposure tool (currently the highest NA available is about 0.93, higher NA's up to at least about 1.3 are projected using liquid immersion techniques.) Using these parameters, the smallest pitch accessible in a single exposure is about 74 nm.

Interferometric lithography (IL) is a maskless technique, involving the interference of a small number of coherent laser beams (often two) that provides a simple way to approach optical limits. For IL, the highest available NA in air is about 0.98, and the corresponding value in water immersion is about 1.41 giving a limiting pitch of about 97 nm in air and about 68 nm with water immersion. Higher index fluids provides another way for decreasing this pitch; indices of about 1.8 for both the immersion fluid and the glass prism appear within the realm of possibility extending the minimum pitch to about 54 nm.

There are many applications that require even smaller pitch structures than are available using these single exposure techniques, and often the economics of a particular application precludes the use of the very expensive tool set that has been optimized for the integrated circuit industry. A general technique known as spatial frequency multiplication has been introduced to extend the range of optical lithography beyond these single exposure limits, and is disclosed in U.S. Pat. No. 6,042,998 to S. R. J. Brueck and Saleem H. Zaidi, entitled "Method and Apparatus for Extending Spatial Frequencies in Photolithography" issued Mar. 28, 2000. The general concept of this invention was to recognize that the spatial frequency limit discussed above refers to the highest spatial frequency that can be transmitted through an optical system (free-space transmission limit in the case of interferometric lithography without immersion). Various nonlinear processes are readily available in semiconductor processing that can be used to add harmonic content to the patterns. A simple example is the use of a high-contrast photoresist layer that converts a sinusoidal aerial image pattern into a square wave developed photoresist pattern. Other examples include, but are not limited to, oxygen plasma thinning of photoresist lines and undercutting of patterns during etching. Thus, it is in general possible to take an aerial image (intensity pattern created by the exposure tool) that in its simplest expression is just:

$$\mathrm{Dose}(x)=1+\cos(2\pi x/d+\phi) \tag{1}$$

where d is the period of the pattern and $\phi$ is the phase of the pattern with respect to the origin (x=0), and using these nonlinear functions convert the pattern into a structure (for example the photoresist height) described by a Fourier series:

$$H(x)=\sum_{i=0}^{\infty} a_i\cos(2\pi ix/d+\varphi) \tag{2}$$

where the $a_i$ are the Fourier coefficients, and in general $a_i \rightarrow 0$ as $i \rightarrow \infty$. It is clear that the expression in equation 2 has higher frequency content (the terms with $i>1$) than the expression in equation 1. However, all of the terms in equation 1 have the same phase inside the cosine function (taken as zero in the expression) and consequently, the density of the pattern (the number of features per unit length) is fixed.

This limitation was overcome in the previous art by storing the pattern in a sacrificial layer, and repeating the process with a phase shift to print a displaced pattern (essentially interpolation of structures at the same pitch to produce a pattern at twice the pitch). The simplest common example is taking two combs and interlacing the tines. An important requirement of this process is alignment between the two layers, because a slight misalignment in placing the second pattern can result in a pitch that is not precisely divided in two.

Even though using phase shift masks in conventional lithographic tools produces a frequency doubled image of the mask pattern (allowing for the magnification of the optical system) as a result of elimination of the zero-order diffraction, all of the patterns produced in this way are within the bandwidth accessible by traditional optical techniques and this doubling does not constitute an example of extending the densities of a pattern beyond those available by standard techniques.

Accordingly, there is a need for new methods for spatial frequency doubling that provides an inexpensive, large area capability with fewer lithographic steps.

SUMMARY OF THE INVENTION

In accordance with the invention, there is a method for self-aligned spatial frequency doubling in one dimension. The method can include forming a film stack over a substrate, wherein the film stack can include a photoresist layer and forming a one-dimensional periodic first pattern having a first pitch p on the photoresist layer using an optical exposure, wherein pitch p is at least smaller than twice the bandpass limit for optical exposures. The method can also include forming a second pattern using the first pattern by nonlinear processing steps, wherein the second pattern has a second pitch $p_2=p/2$.

According to various embodiments, there is a method for self-aligned spatial frequency doubling of a two dimensional pattern. The method can include (a) forming a film stack over a substrate, wherein the film stack can include a photoresist layer, (b) forming a one-dimensional periodic first pattern having a first pitch p on the photoresist layer using an optical exposure, wherein pitch p is at least smaller than twice the bandpass limit for optical exposures, and (c) forming a second pattern using the first pattern by nonlinear processing steps, wherein the second pattern has a second pitch $p_2=p/2$. The method can further include repeating the steps a-c to form a third pattern at an angle to the first pattern, wherein the third pattern can have a pitch of $p_3$ of about p/2.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Figure 1A:
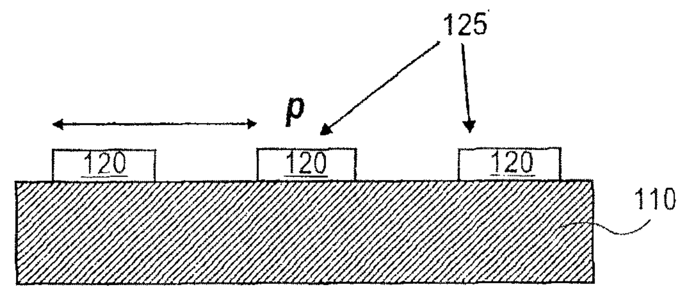
FIGS. 1A-1D illustrate an exemplary method for self-aligned spatial frequency doubling, according to various embodiments of the present teachings.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

According to various embodiments, there is a method for self-aligned spatial frequency doubling in one dimension. The method can include forming a film stack over a substrate, wherein the film stack includes a photoresist layer. The method can also include forming a one-dimensional periodic first pattern having a first pitch p on the photoresist layer using an optical exposure, wherein the first pitch p is at least smaller than twice the bandpass limit for optical exposures. The method can further include forming a second pattern using the first pattern by nonlinear processing steps, wherein the second pattern can have a second pitch $p_2=p/2$, wherein the second pitch $p_2$ corresponds to a spatial frequency that is higher than the spatial frequency corresponding to the bandpass limit of optical exposures. In some embodiments, the second pattern can be formed in the substrate. In other embodiments, the second pattern can be formed over the substrate. In various embodiments, the method can further include transferring the second pattern to the substrate.

FIGS. 1A-1E depict an exemplary method for self-aligned spatial frequency doubling in one dimension. In various embodiments, the step of forming a film stack over a substrate can include forming a protective layer 120 over a crystalline substrate 110. In some embodiments, the crystalline substrate 110 can include silicon (100). In other embodiments, the crystalline substrate 110 can include gallium arsenide. In various embodiments, the protective layer 120 can include any suitable metal, such as, for example, chromium and nickel. In some embodiments, the protective layer 120 can include dielectric material, such as, for example, silicon nitride and silicon oxide.

The method can further include forming a one-dimensional periodic first pattern 125 having a first pitch p on the protective layer 120 using an optical exposure, wherein the first pitch p is at least smaller than twice the bandpass limit for optical exposures, as shown in FIG. 1A. In various embodiments, the first pattern 125 having a first pitch p can be along a first direction of the crystalline substrate 110. In some embodiments, the first pattern 125 can be created by photolithography. In other embodiments, the pattern 125 can be created using interferometric lithography. Yet in some other embodiments, the pattern 125 can be created using immersion interferometric lithography. A pitch of about 95 nm can be created using a 193 nm laser source and immersion interferometric lithography. An apparatus for carrying out immersion interferometric lithography is described in the U.S. patent application Ser. No. 11/417,031, the disclosure of which is incorporated by reference herein in its entirety.

Figure 1B:
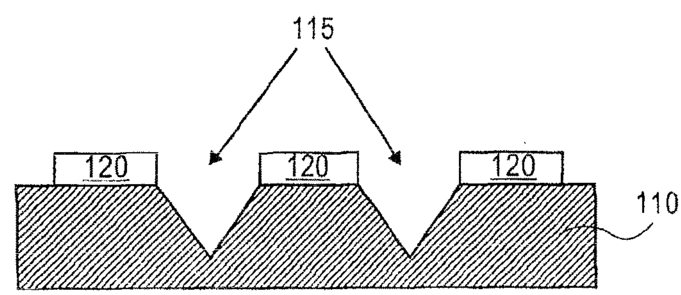
Figure 1C:
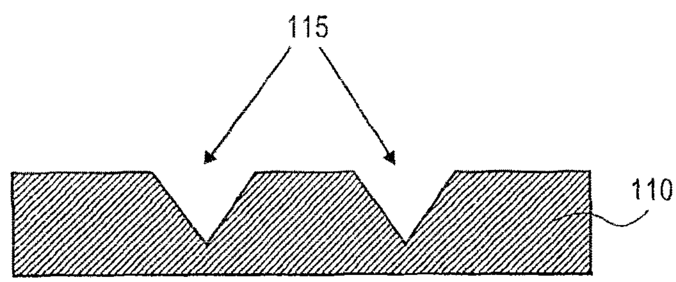

The method can also include forming a second pattern 116 using the first pattern 125 by nonlinear processing steps. The nonlinear processing steps can include anisotropically etching the crystalline substrate 110 to form a second pattern 115 in the crystalline substrate 110, as shown in FIG. 1B. In various embodiments, wherein the crystalline substrate 110 includes silicon (100), etching can be carried out using wet etchants, such as, for example, potassium hydroxide. One of ordinary skill in the art would know that the etch rate of the (100) face of silicon can be about 400 times the etch rate of the (111) face of silicon at about 80° C. Therefore, if the protective layer 120 is deposited along the <110> direction of the crystalline substrate 110 including silicon (100) and the crystalline substrate 110 is etched using potassium hydroxide, V-grooves can be etched into the silicon that terminate in the low etch rate (111) faces, as shown in FIG. 1B.

Figure 1D:
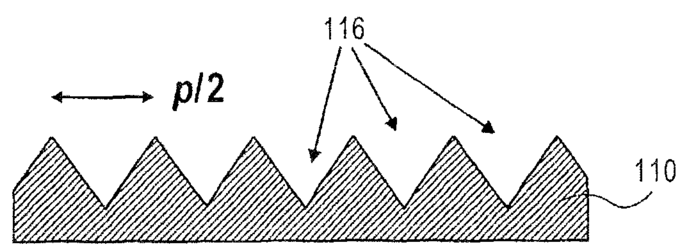

The nonlinear processing steps can further include removing the protective layer 120, as shown in FIG. 10 and anisotropically etching the crystalline substrate 110 to form a second pattern 116 in the crystalline substrate 110 having a pitch of about p/2 along the first direction of the crystalline substrate 110, as shown in FIG. 1D. Again for the crystalline substrate 110 including silicon, the (100) face of silicon can etch much faster as compared to that of the already established (111) face of silicon, thereby anisotropic etching can result in a third pattern 116 at twice the spatial frequency of the first pattern 125 and the second pattern 115. Thus, starting with a first pattern 125 on the protective layer 120 having a pitch of about 95 nm, a third pattern having the frequency-doubled pitch of about 45 nm can be created on the crystalline substrate 110 using the exemplary method described above. One of ordinary skill in the art would know that a pitch of about 45 nm is well beyond the frequency that can be written in the lithographic exposure (limited by transmission medium bandpass effects to $\lambda/2n=193/2*1.44=67$ nm).

FIGS. 2A-2E shows another exemplary method for self-aligned spatial frequency doubling in one dimension. The method can include forming a film stack over a substrate 210, wherein the film stack includes a photoresist (resist) layer 230. In some embodiments, the substrate 210 can include an unpatterned silicon wafer. In other embodiments, the substrate 210 can include a silicon wafer after some fabrication steps. In various embodiments, the substrate 210 can include a silicon wafer having one or more layers of silicon oxide, silicon nitride, and other dielectric material. The method can include forming a one-dimensional periodic first pattern 235 having a first pitch p on the resist layer 230. In various embodiments, the step of forming a one-dimensional periodic first pattern 235 can include forming a first resist pattern 235 including a lower first resist layer 232 having a first thickness of h and a width of about p/4, and a top first resist layer 234 over the lower first resist layer 232, wherein the top first resist layer 234 can have a second thickness of less than h and a width of about 3p/4, wherein p is a pitch of a lithographic exposure. In various embodiments, the lower first resist layer 232 and the top first resist layer 234 can form a “T” shaped structure. In some embodiments, the first resist pattern 235 can be formed by exposing and developing the top first resist layer 234 to a desired dimensions and then undercutting the lower first resist layer 232 using a selective isotropic etch process. In various embodiments, the first resist layer 230 can include a stacked resist structure wherein the lower first resist layer 232 and the top first resist layer 234 can have different dose sensitivities. In various embodiments, the lower first resist layer 232 can include an anti-reflective coating (ARC) layer and the top first resist layer 234 can include a photoresist. In certain embodiments, the lower first resist layer 232 and the top first resist layer 234 can be an i-line photoresist. In other embodiments, the lower first resist layer 232 and the top first resist layer 234 can be a g-line or a deep UV photoresist. Non limiting exemplary photoresist can be “EPIC” resists product series manufactured by Rohm & Haas Electronic Materials (Marlborough, Mass.), “ARF” resist product series manufactured by JSR Micro, Inc. (Sunnyvale, Calif.), and “AX” resist product series manufactured by AZ Electronic Materials USA Corp (Charlotte, N.C.). In some embodiments, the first resist layer 232 can include a bottom anti-reflective coating (BARC) for i-line photoresist. Yet in other embodiments, the first resist layer 232 can include a g-line BARC or a deep UV BARC. Non limiting examples of BARC can be “ARC®,” product series, manufactured by Brewer Science, Inc. (Rolla, Mo.), “AR™ 40A, manufactured by Rohm and Haas (Philadelphia, Pa.), and “ARF” anti-reflective coating product series, manufactured by AZ Electronic Materials USA Corp (Charlotte, N.C.). In an alternative embodiment, the top layer 234 can be formed with a metal such as, for example, chromium and nickel or a dielectric such as, for example, silicon dioxide.

Figure 2A:
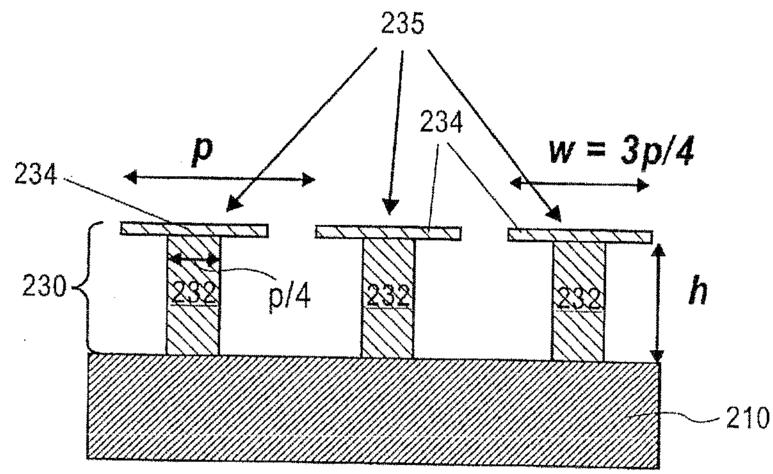
FIGS. 2A-2H illustrate an exemplary method for self-aligned spatial frequency doubling of a two dimensional pattern, in accordance with the present teachings.
Figure 2B:
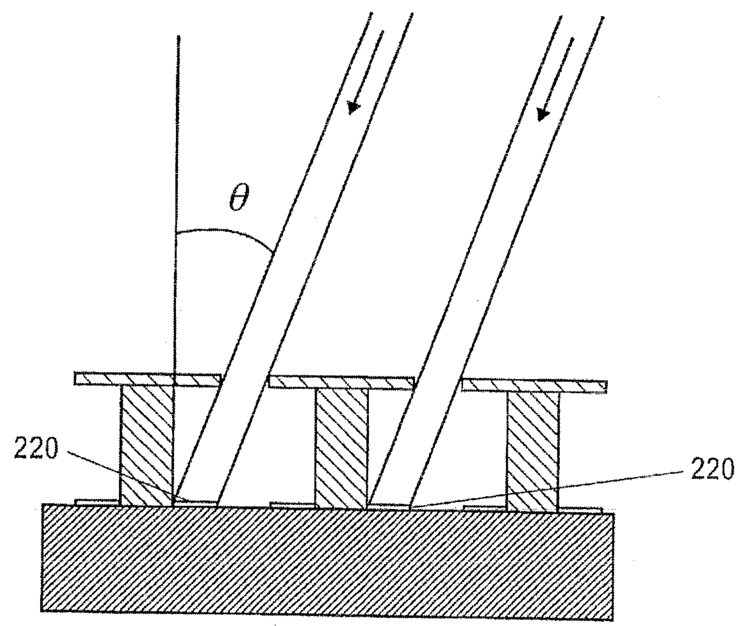
Figure 2C:
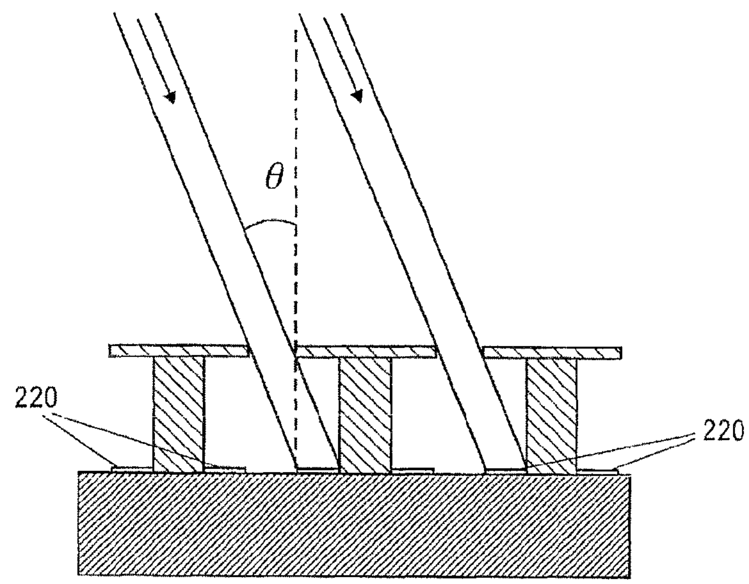

The method can also include forming a second pattern 225 using the first pattern by nonlinear processing steps, as shown in FIGS. 2B-2E. FIGS. 2B and 2C show deposition of a protective layer 220 over the substrate 210 under each of a plurality of overhangs of the top first resist layer 234 of the first resist layer 230 such that the protective layer 220 forms a second pattern 225 having a period of p/2. In various embodiments, the protective layer 220 can include any suitable metal, such as, for example, chromium and nickel. In some embodiments, the protective layer 220 can include dielectric material, such as, for example, silicon nitride and silicon oxide. In some embodiments, the step of depositing a protective layer 220 over the substrate 210 can include shadow evaporating one or more of a metal layer and a dielectric layer at an angle $\theta=\tan^{-1}(p/4h)$. In other embodiments, the step of depositing a protective layer 220 over the substrate 210 can include depositing the protective layer 220 over the substrate 210 at a first side of the first resist layer 230, as shown in FIG. 2B and then depositing the protective layer 220 over the substrate 210 at a second side of the first resist layer 230, as shown in FIG. 2C. The protective layer 220 can be deposited using any suitable method that can provide line of sight deposition and also provide narrow angle of arrival of atomic/molecular species. Exemplary deposition methods include, but are not limited to e-beam evaporation, filament evaporation, sputter deposition, chemical vapor deposition, low pressure chemical vapor deposition, and plasma enhanced chemical vapor deposition. Since, e-beam evaporation is a low pressure deposition technique and essentially line-of-sight, it is the preferred technique.

Figure 2D:
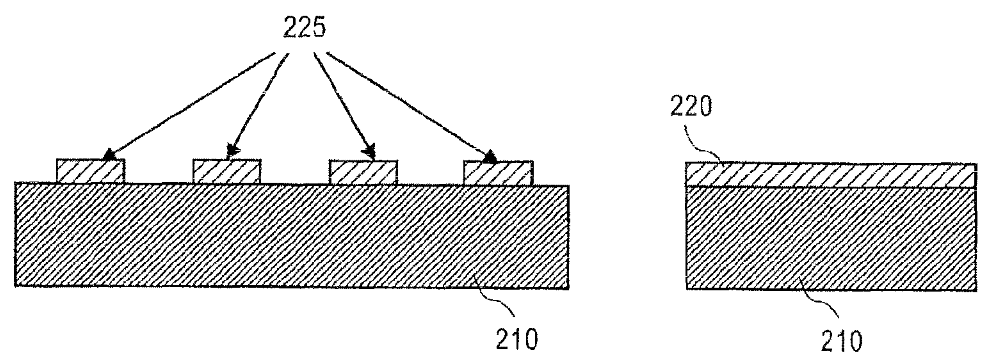
Figure 2E:
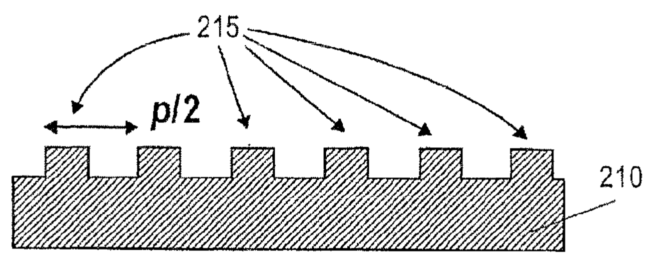

The nonlinear processing steps can also include removing the first resist layer 230, thereby leaving a second pattern 225 of the protective layer 220, as shown in FIG. 2D. In various embodiments, the method can further include etching the substrate 210 to transfer the first pattern 225 to the substrate 210 thereby forming a patterned layer 215, as shown in FIG. 2E

Figure 3A:
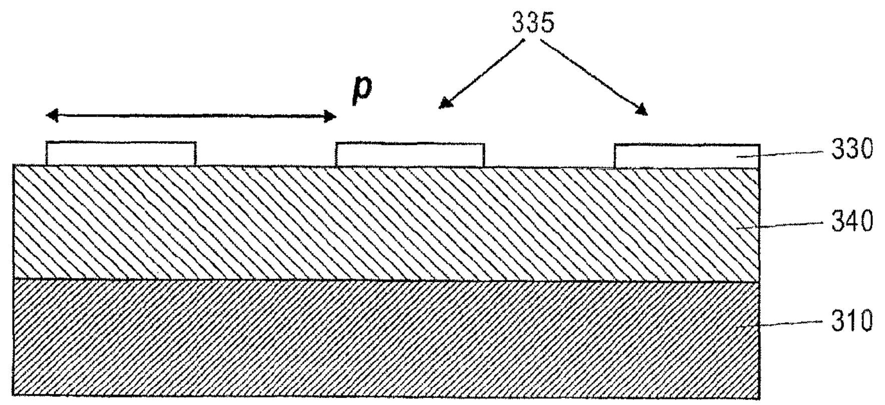
FIGS. 3A-3F illustrate an exemplary method for self-aligned spatial frequency doubling in one dimension, in accordance with the present teachings.
Figure 3B:
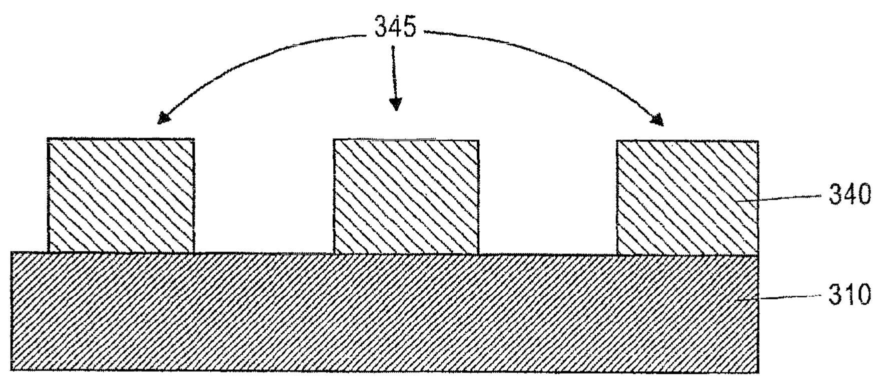
Figure 3C:
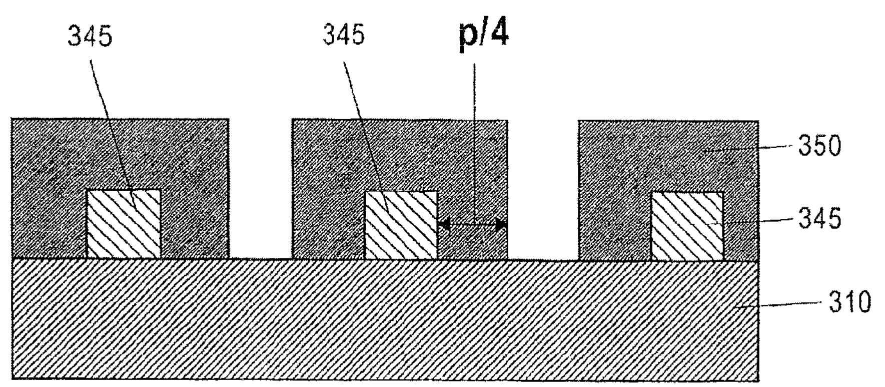
Figure 3D:
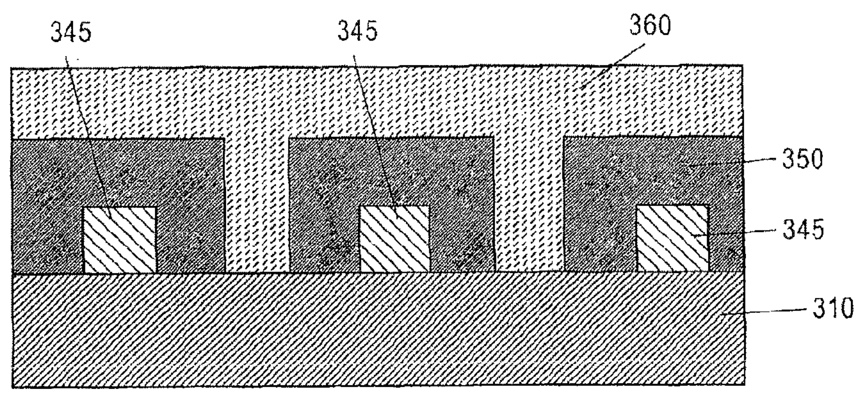

FIGS. 3A to 3F depict another exemplary method for self-aligned spatial frequency doubling in one dimension. The method can include providing a film stack over a substrate, wherein the film stack includes a photoresist (resist) layer 330 over a sacrificial layer 340. In various embodiments, the resist 330 can be an i-line photoresist. In other embodiments, the resist 330 can be a g-line or a deep UV photoresist. In some embodiments, the sacrificial layer 340 can include polycrystalline silicon, wherein the crystallite size is small enough so as to not add to line edge roughness in a second pattern 355. In other embodiments, the sacrificial layer 340 can include amorphous silicon. The method can further include forming a one-dimensional periodic first pattern 335 having a first pitch p on the resist layer 330 using an optical exposure, as shown in FIG. 3A. In some embodiments, the resist 330 can be patterned using one or more of photolithography, interferometric lithography, and immersion interferometric lithography. The method can further include forming a forming a second pattern 355 using the first pattern 335 by nonlinear processing steps, wherein the second pattern 355 has a second pitch $p_2=p/2$, as shown in FIGS. 3B-3F. FIG. 3B shows anisotropically etching the sacrificial layer 340 to form a patterned sacrificial layer 345. Any suitable etching process such as, for example, inductively coupled plasma etching and reactive ion etching can be used. FIG. 30 shows forming a conformal layer 350 over the patterned sacrificial layer 345, wherein a sidewall thickness of the conformal layer 350 can be about p/4. In various embodiments, the conformal layer 350 can be an oxide layer, which both consumes some of the sacrificial layer 340 and also expands beyond the sacrificial layer 340. In some embodiments, the conformal layer 360 can include dielectric material, such as, for example, PMMA. FIG. 3D shows depositing a polymer layer 360 over the conformal layer 350 such that spaces between the conformal layer 350 can be filled. In some embodiments, the polymer layer 360 can be thicker than the conformal layer 350. In other embodiments, the polymer layer 360 can be designed to just match the thickness of the conformal layer 350. Any suitable material can be used for the deposition of the polymer layer 360, including, but not limited to polymethylmethacrylate (PMMA) and benzocyclobutene (BCB) based polymers. Polymer layer 360 can be deposited by conventional techniques, such as, for example, spin coating.

Figure 3E:
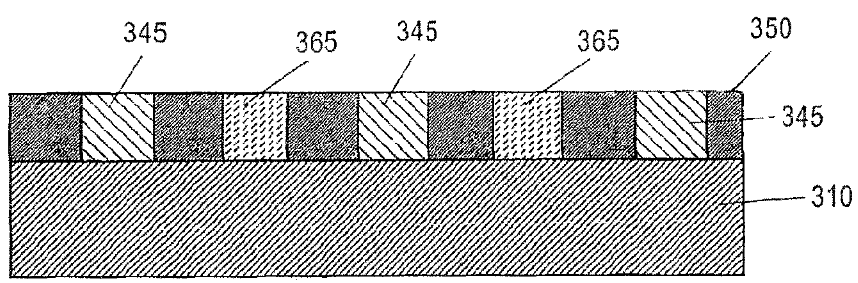
Figure 3F:
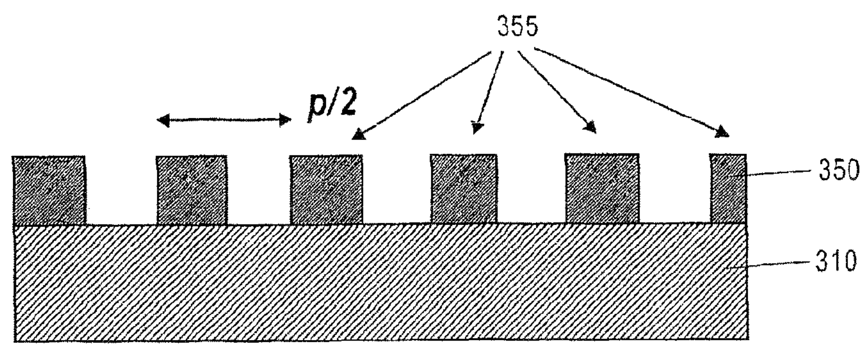

The step of forming a forming a second pattern 355 using the first pattern 335 by nonlinear processing steps can further include etching a portion of the polymer layer 360 and a top portion of the conformal layer 350 to expose a top portion of the patterned sacrificial layer 345 as shown in FIG. 3E. In some embodiments, a low pressure directional etch can be used to etch back the polymer layer 360 and the conformal layer 350. The nonlinear processing steps can further include removing the remaining polymer layer 365 and the patterned sacrificial layer 345 such that the remaining conformal layer 350 forms a second pattern 355 having a pitch of p/2, as shown in FIG. 3F. In some embodiments, the remaining polymer layer 365 can be removed with an appropriate solvent. In other embodiments, the patterned sacrificial layer 345 can be preferentially etched. For example, the patterned sacrificial layer 345 including silicon can be preferentially etched using fluorine containing gases, such as, for example, $XeF_2$, Fluorine. In some embodiments, the remaining conformal layer 350 can be used to transfer the second pattern 355 to the substrate 310. In some embodiments, the method can further include repeating the process shown in FIGS. 3A-3F to form a two dimensional pattern.

Figure 4A:
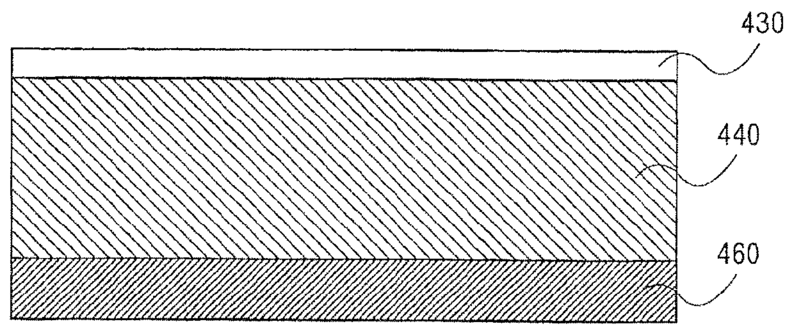
FIGS. 4A-4F illustrate another exemplary method for self-aligned spatial frequency doubling in one dimension, according to various embodiments of the present teachings.
Figure 4B:
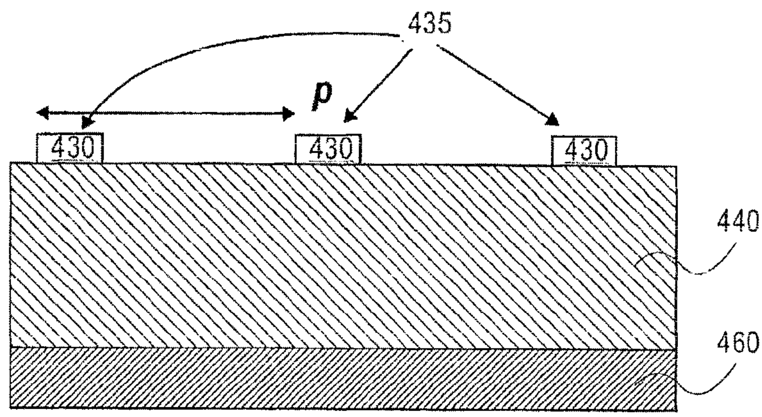
Figure 4C:
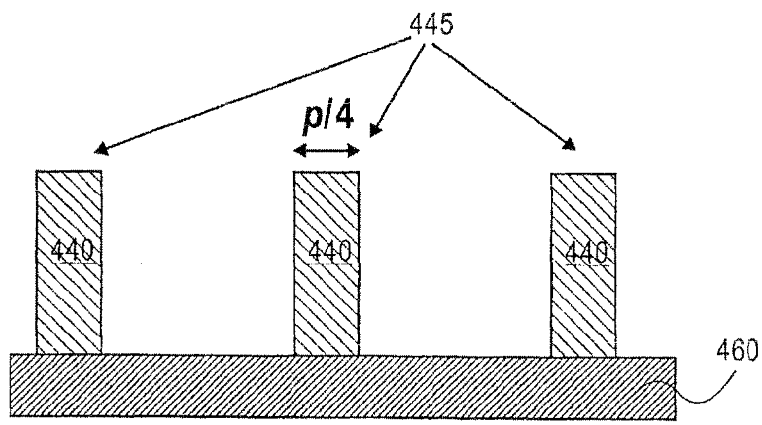
Figure 4D:
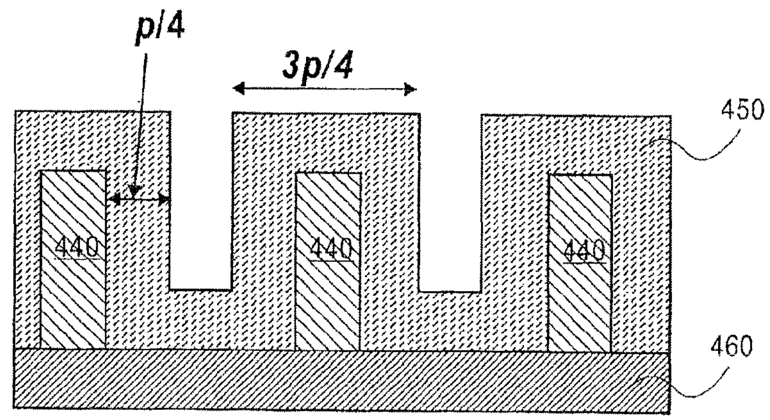
Figure 4E:
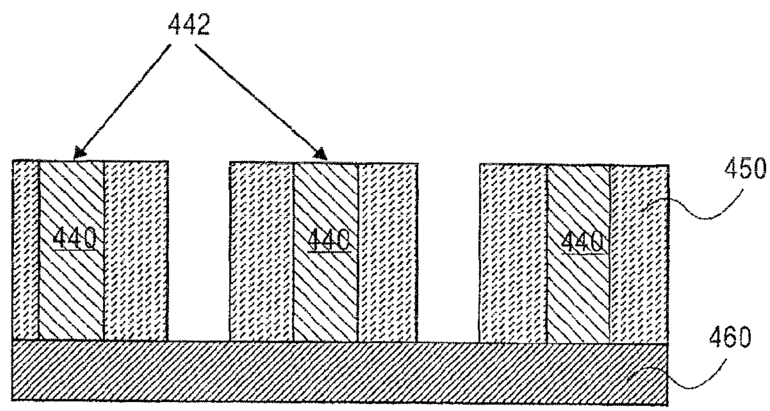
Figure 4F:
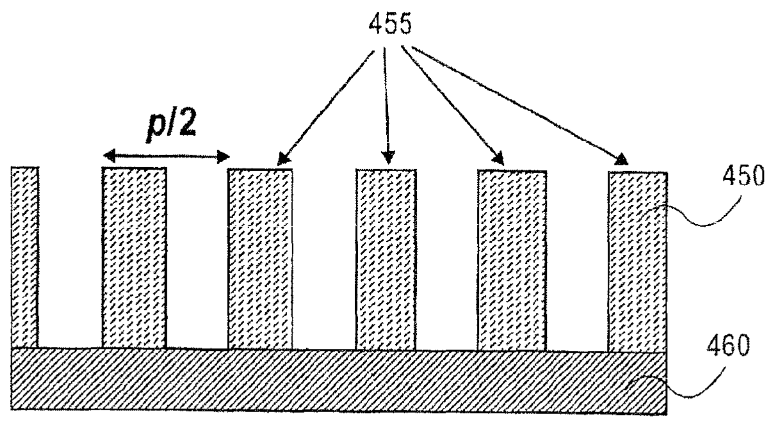

FIGS. 4A to 4F depict another exemplary method for self-aligned spatial frequency doubling in one dimension. The method can include forming a film stack over a substrate (not shown). In various embodiments, the step of forming a film stack can include forming a sacrificial layer 440 over an etch stop layer 460 and forming a resist layer 430 over the sacrificial layer 440, as shown in FIG. 4A. The method can further include forming a one-dimensional periodic first pattern 435 having a first pitch p on the resist layer 430, as shown in FIG. 4B. The method can further include forming a second pattern 455 using the first pattern 435 by nonlinear processing steps, as shown in FIGS. 4C-4F, wherein the second pattern 455 has a second pitch $p_2$=p/2. The nonlinear processing steps can include etching the sacrificial layer 440 to form a patterned sacrificial layer 445, wherein the patterned sacrificial layer 445 has a line width of about p/4, as shown in FIG. 4C. The nonlinear processing steps can further include forming a conformal layer 450 over the patterned sacrificial layer 445, wherein a sidewall thickness of the conformal layer 450 can be about p/4, as shown in FIG. 4D. The nonlinear processing steps can also include etching a portion of the conformal layer 450 to expose a top surface 442 of the sacrificial layer 440 and to expose a portion of the etch stop layer 460 between the conformal layer 450, as shown in FIG. 4E and removing the patterned sacrificial layer 445 to form a second pattern 455 having a second pitch of $p_2$=p/2 on the conformal layer 450, as shown in FIG. 4F.

FIGS. 5A-5E illustrate another exemplary method for self-aligned spatial frequency doubling in one dimension. The method can include forming a film stack over a substrate 510, wherein the film stack can include a lower layer 532 including one or more of an anti-reflective coating and a nitride over a substrate and a top layer 534 including one or more of a polymer and a photoresist over the lower layer 532. Any suitable polymer can be used, such as, for example, PMMA and BCB based polymers. Non limiting exemplary photoresist can be "EPIC" resists product series manufactured by Rohm & Haas Electronic Materials (Marlborough, Mass.), "ARF" resist product series manufactured by JSR Micro, Inc. (Sunnyvale, Calif.), and "AX" resist product series manufactured by AZ Electronic Materials USA Corp (Charlotte, N.C.). In various embodiments, the lower layer 532 can include a g-line BARC or a deep UV BARC. Non limiting examples of BARC can be "ARCO" product series, manufactured by Brewer Science, Inc. (Rolla, Mo.), "AR™ 40A, manufactured by Rohm and Haas (Philadelphia, Pa.), and "ARF" anti-reflective coating product series, manufactured by AZ Electronic Materials USA Corp (Charlotte, N.C.).

Figure 5A:
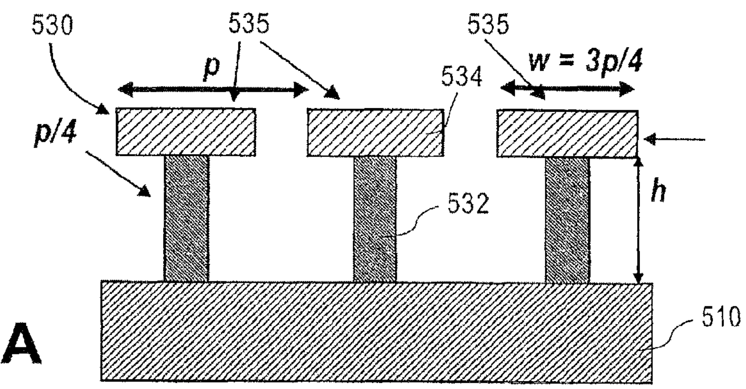
FIGS. 5A-5E illustrate an exemplary method for self-aligned spatial frequency doubling in one dimension, according to various embodiments of the present teachings.
Figure 5B:
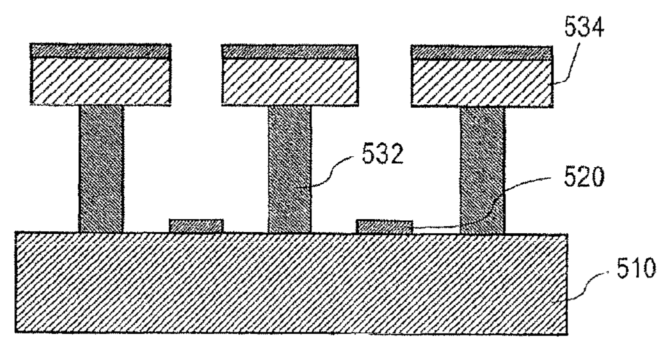
Figure 5C:
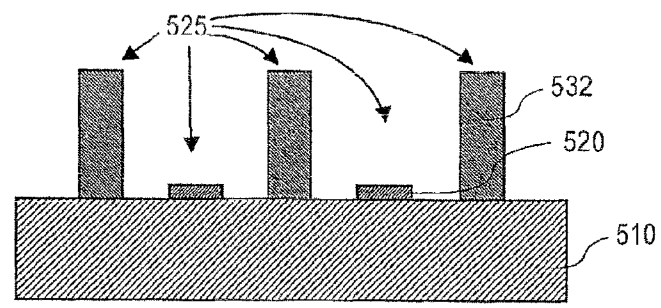
Figure 5D:
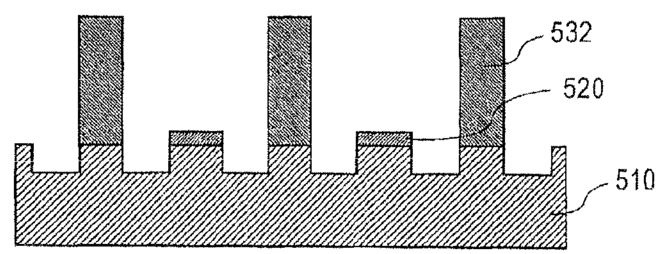
Figure 5E:
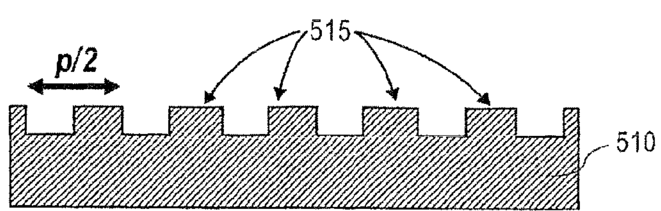

The method can further include forming a one-dimensional periodic first pattern 535 having a first pitch p on the film stack as shown in FIG. 5A, wherein the one dimensional periodic pattern includes a plurality of "T" structures 530 disposed on the substrate 510. The "T" structure 530 can include a lower layer 532 having a first thickness of h and a width of about p/4, and a top layer 534 over the lower layer 532, wherein the top layer 534 includes a second thickness of less than h and a width of about 3p/4, wherein p is a pitch of a lithographic exposure. The method can further include forming a second pattern 525, 515 using the first pattern 535 by nonlinear processing steps, as shown in FIGS. 5B-5E. The nonlinear processing steps can include depositing a hard mask material 520 vertically over the substrate 510 such that the hard mask material 520 forms a first pattern having a period of p, as shown in FIG. 5B. In various embodiments, the hard mask material 520 can include any suitable metal, such as, for example nickel and chromium. In some embodiments, the hard mask material 520 can include any suitable dielectric, such as for example, silicon oxide and silicon nitride. The nonlinear processing steps can also include removing the top layer 534 thereby forming a second pattern 525 having a pitch of p/2, as in FIG. 5C, etching the substrate 510 to form the second pattern 515 in the substrate, as in FIG. 5D, and removing the lower layer 532 and the hard mask material 520, as shown in FIG. 5E. Any suitable anisotropic etching technique can be used including, but not limited to inductively coupled plasma and reactive ion etching.

Figure 6A:
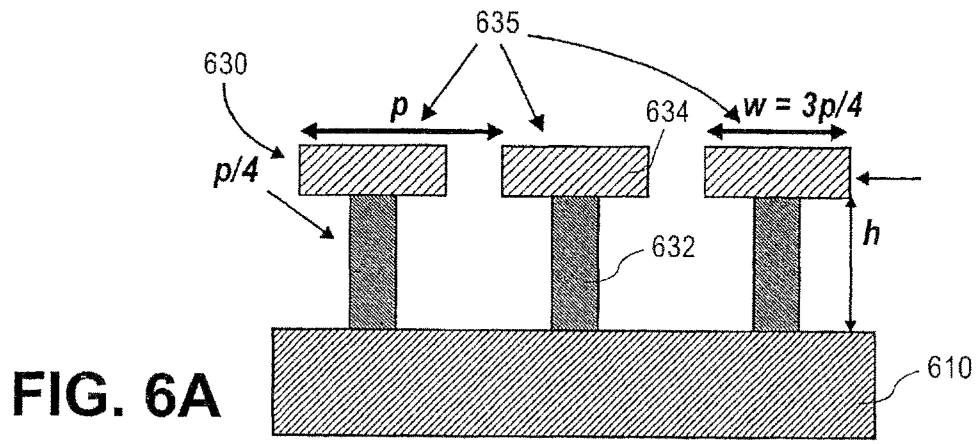
FIGS. 6A-6F illustrate another exemplary method for self-aligned spatial frequency doubling in one dimension, according to various embodiments of the present teachings.
Figure 6B:
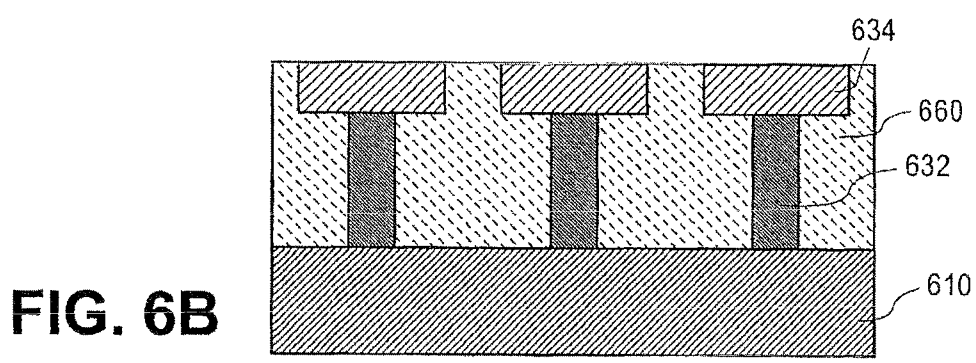
Figure 6C:
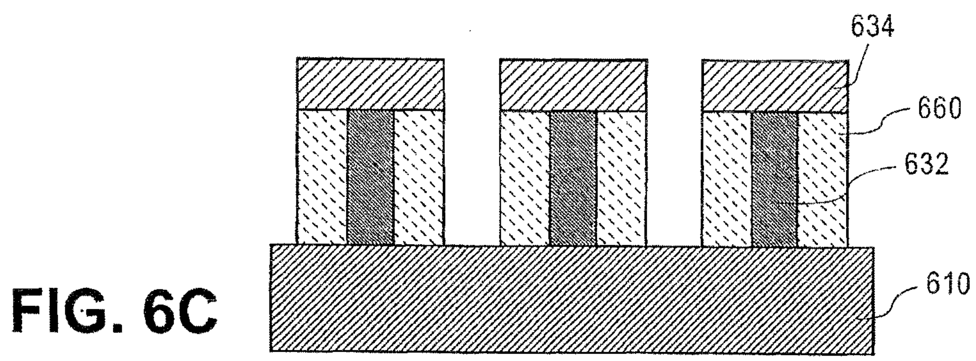
Figure 6D:
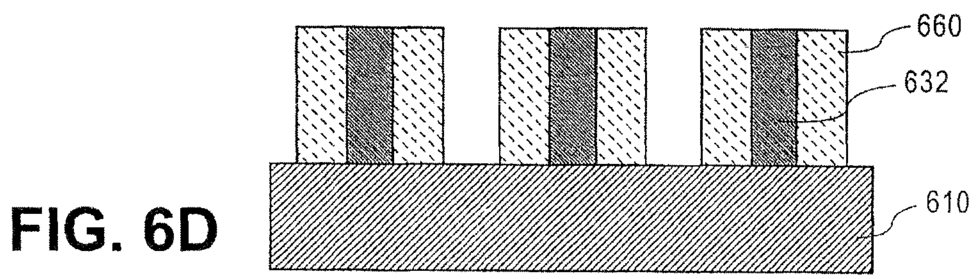
Figure 6E:
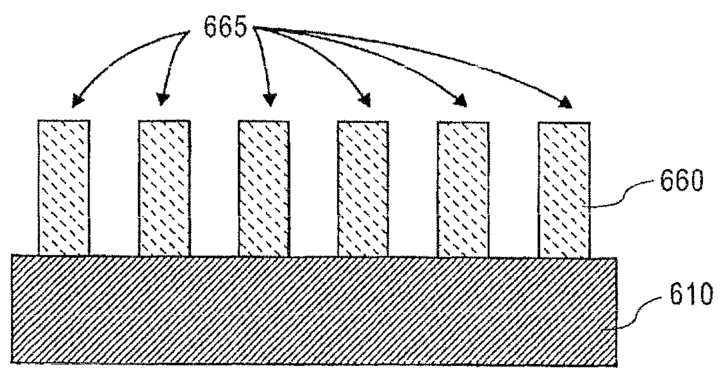
Figure 6F:
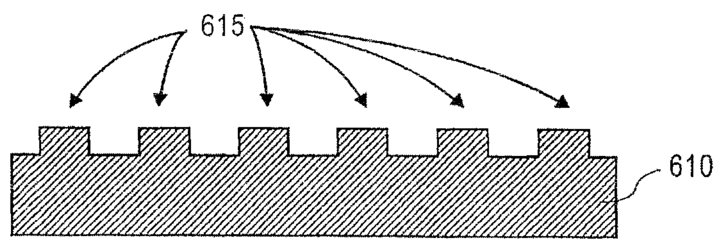

FIGS. 6A-6F illustrate another exemplary method for self-aligned spatial frequency doubling in one dimension. The method can include forming a film stack over a substrate, wherein the film stack can include a lower layer 632 including one or more of a polymer, a photoresist and a dielectric such as for example silicon nitride over a substrate and a top layer 634 including a hard mask material, such as, for example, an oxide or a metal. The method can further include forming a one-dimensional periodic first pattern 635 having a first pitch p on the film stack as shown in FIG. 5A, wherein the one dimensional periodic pattern 635 can include a plurality of "T" structures 630 disposed on the substrate 610. The "T" structure 630 can include a lower layer 632 having a first thickness of h and a width of about p/4, and a top layer 634 over the lower layer 632, wherein the top layer 634 includes a second thickness of less than h and a width of about 3p/4, wherein p is a pitch of a lithographic exposure. The method can further include forming a second pattern 665, 615 using the first pattern 535 by nonlinear processing steps, as shown in FIGS. 6B-5E. The nonlinear processing steps can include planarizing the "T" structure 630 with a polymer 660, as shown in FIG. 6B and anisotropically etching the polymer 660 through the gaps in the top hard mask layer 634, as in FIG. 6C. In various embodiments, the polymer 660 can include any suitable polymer, including, but not limited to, PMMA and BCB based polymers. In various embodiments, the polymer 660 can be anisotropically etched using one or more of inductively coupled plasma and reactive ion etching. The nonlinear processing steps can further include removing the top hard mask layer 634 as shown in FIG. 6D and the lower layer 632 as shown in FIG. 6E, thereby forming a second pattern 665 with the polymer 660 having a pitch of p/2. The method for self-aligned spatial frequency doubling in one dimension can also include etching the substrate 610 thereby forming the second pattern 615 having a pitch of p/2 in the substrate 610, as shown in FIG. 6F.

According to various embodiments, there is a method for self-aligned spatial frequency doubling of a two dimensional pattern. The method can include (a) forming a film stack over a substrate, wherein the film stack includes a photoresist layer, (b) forming a one-dimensional periodic first pattern having a first pitch p on the photoresist layer using an optical exposure, wherein pitch $p_1$ is at least smaller than twice the band pass limit for optical exposures, and (c) forming a second pattern using the first pattern by nonlinear processing steps, wherein the second pattern has a second pitch $p_2$=p/2. The method can further include repeating the steps a-c to form a third pattern at an angle to the first pattern, wherein the third pattern has a pitch of about p/2. In some embodiments, the method can also include transferring the second pattern of pitch $p_2$ and the third pattern of pitch $p_3$ into the film stack. In other embodiments, the method can include transferring the second pattern of pitch $p_1$ and the third pattern of pitch $p_3$ into the substrate.

Figure 2F:
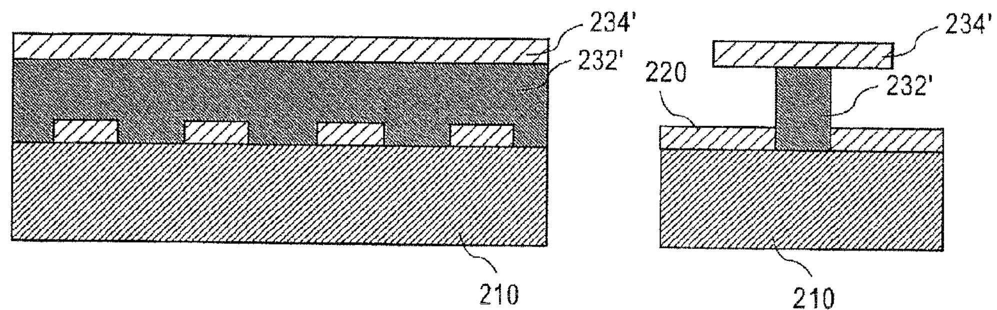
Figure 2G:
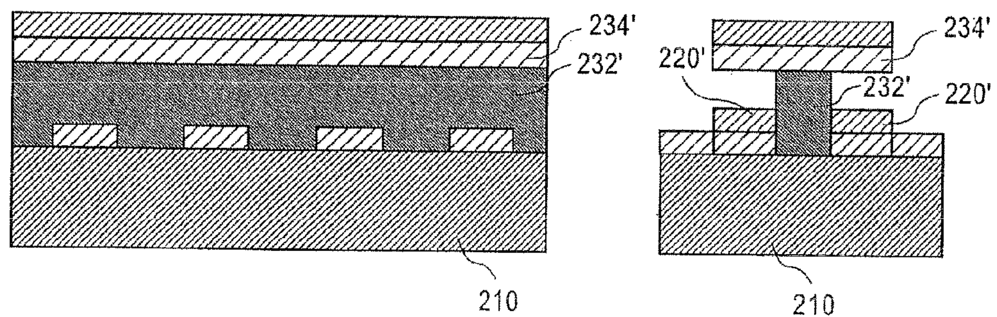
Figure 2H:
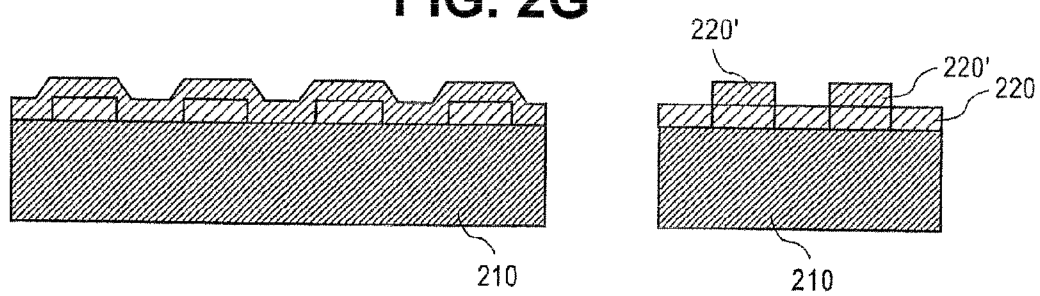
Figure 2H:
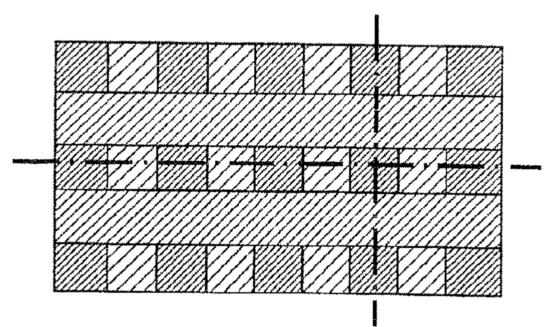

An exemplary method for self-aligned spatial frequency doubling of a two dimensional pattern is shown in FIGS. 2A-2H. FIGS. 2A-2E shows a method for self-aligned spatial frequency doubling in one dimension, as described earlier. The method for self-aligned spatial frequency doubling of a two dimensional pattern can include forming a second resist layer 230' having a second resist pattern at an angle to the first resist pattern 235 over the substrate 210, as shown in FIG. 2F. In some embodiments, the angle between the first resist pattern and the second resist pattern can be 90°. In various embodiments, the second resist layer 230' can include a lower second resist layer 232' having a third thickness of h and a width of about p/4, and a top second resist layer 234' over the lower second resist layer 232', having a fourth thickness of less than h and a width of about 3p/4, wherein p is a pitch of a lithographic exposure and said widths are formed as a result of a lithographic exposure, development and etch cycle with similar parameters to those used to form the first resist pattern in FIG. 2A. The method can further include depositing one or more of a metal layer and a dielectric layer under each overhang of the top second resist layer 234', as shown in FIG. 2G, such that the one or more of a metal layer and a dielectric layer forms a second pattern with a period of p/2, wherein the second pattern is at an angle to the first pattern 235 and removing the second resist layer 230', as shown in FIG. 2H.

Another exemplary method for forming a two-dimensional pattern can include filling the second pattern 116 in the crystalline substrate 110, as shown in FIG. 1D with a planarization material. In various embodiments, the planarization material can include any suitable dielectric material, such as, for example, silicon oxide, silicon nitride, and sapphire. In other embodiments, the planarization material can include any suitable metal. The method can further include isotropically etching back the planarization material and the crystalline substrate to expose a second face of the crystalline substrate, for example, for silicon (100) as the crystalline substrate 110, the face (100) of the silicon an be exposed. The method can further include repeating the sequence of lithographic exposure and pattern definition to define a second protective layer with the same pattern as in FIG. 1A, but in the orthogonal direction. Then carrying out the same sequence of etching and removal steps to result in a 2D frequency doubled pattern. In some embodiments, the method can include flattening a top surface of the third pattern 116 of the crystalline substrate 110, to provide a new high etch rate surface. Flattening of the top surface can be done using any suitable technique, such as, for example, dry etching. An example of a related technique (not involving frequency doubling but illustrating the capabilities of 2D Si patterning using KOH wet etch processes) is disclosed in: "*Nanoscale Two-Dimensional Patterning on Si* (001) *by Large-Area Interferometric Lithography and Anisotropic Wet Etching*", S.C. Lee and S. R. J. Brueck, Journal of Vacuum Science and Technology 22, 1949-1952 (2004), the disclosure of which is incorporated by reference herein in its entirety.

Conventional techniques for spatial frequency doubling (and in general for spatial frequency multiplication) involve nonlinear process operations on each exposure to increase the spatial frequency content of the resulting pattern from each exposure, and combination of two or more said nonlinearly frequency-extended patterns to extend the pattern density. The object of the present teachings has been to develop self-aligned techniques that involve only a single lithographic step for a 1D pattern and only a pair of lithographic steps for a 2D pattern followed by nonlinear processes that can result in a frequency doubling (or higher multiplicative factor) of the original pattern. These processes are of use in many applications in which a periodic pattern, at a density beyond that available in a single optical/interferometric exposure is required. Examples include silicon integrated circuits, high density patterned storage media and sub-wavelength texturing of optical materials (for example for wire-grid polarizers which typically require a period $\leqq\lambda_{op}/10$, where $\lambda_{op}$ is the operating wavelength of the polarizer (not the exposure wavelength).

According to various embodiments, there are devices formed by the disclosed methods. In some embodiments, the devices formed by the disclosed methods can include, but not limited to gratings, hard disk drives, liquid crystal panels to align liquid crystals, and various integrated circuits. Integrated circuits have historically been the major driver in the push to finer scale lithography. The industry roadmap, the International Technology Roadmap for Semiconductors (ITRS), www.itrs.net, details both the challenges and the opportunities. An underlying premise of the roadmap is that the historical 0.7 shrink/2 year cycle, one version of "Moore's Law," will continue unabated, the job of the ITRS is to lay out the manufacturing pathway and to identify the challenges that must be addressed. The first levels of lithography for an integrated circuit are typically at the smallest dimensions. One of these levels is a transistor gate level, which is typically a 1D layout, that is, the smallest dimensions are all in one direction, the gate width, while the length of the gate is typically several times longer than this width. Another important level is the contact via level (holes through a dielectric layer to make contact with the gate). These are typically in a 2D grid. There are many other emerging devices/applications for nanoscale lithography. One example is isolated domains for magnetic storage, there the industry is pushing for extremely small dimensions, as small as ~10-nm half pitch to continue the historical trend of density increases in magnetic memory.

While the invention has been illustrated respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the phrase "X comprises one or more of A, B, and C" means that X can include any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for self-aligned spatial frequency doubling in one dimension comprising:

forming a film stack over a substrate, wherein the film stack comprises a first pattern of a sacrificial material having a first pitch p;

forming a conformal material by consuming a portion of the first pattern of the sacrificial material such that the conformal material has a substantially uniform thickness U-shape to surround each remaining portion of the sacrificial material, wherein a sidewall thickness of the substantially U-shape of the conformal material is about p/4 and each remaining portion of the sacrificial material has a width of about p/4;

depositing a polymer material over the conformal material to fill spaces between adjacent portions of the conformal material;

etching a portion of the polymer material and etching a top portion of the conformal material to expose a top portion of the sacrificial material; and removing remaining portions of both the polymer material and the sacrificial material such that remaining portions of the conformal material form a second pattern having a pitch of p/2.

2. The method of claim 1 further comprising transferring the second pattern to the substrate.

3. The method of claim 1, wherein the sacrificial material comprises silicon, the conformal material comprises $SiO_2$, and the polymer material comprises polymethylmethacrylate (PMMA) or benzocyclobutene (BCB).

4. A method for self-aligned spatial frequency doubling in one dimension comprising:

forming a first pattern having a first pitch p over a sacrificial layer, wherein the sacrificial layer is disposed over an etch stop layer and the etch stop layer is disposed over a substrate;

patterning the sacrificial layer having a patterned line width of about p/4 using the first pattern as an etching mask;

forming a conformal layer on the patterned sacrificial layer, wherein a sidewall thickness of the conformal layer is about p/4, wherein the conformal layer comprises a dielectric material;

etching a portion of the conformal layer to expose a top surface of the sacrificial layer and to expose a portion of the etch stop layer between sidewalls of adjacent portions of the conformal layer; and removing the patterned sacrificial layer to form a frequency doubled dielectric material layer having a second pitch $p_2=p/2$.

5. The method of claim 4, further comprising transferring a second pattern to the etch stop layer or the substrate.

6. A method for self-aligned spatial frequency doubling in one dimension comprising:

forming a plurality of "T"-shaped structures on a substrate, wherein the "T"-shaped structure comprises a lower layer having a first thickness of h and a width of about p/4, and a top layer having a second thickness of less than h and a width of about 3p/4, wherein the plurality of "T"-shaped structures are at a pitch p;

depositing a hard mask material vertically on the substrate between adjacent top layers of the plurality of "T"-shaped structures such that the hard mask material forms a pattern having a period of p;

removing the top layer of each of the plurality of "T"-shaped structures; and etching the substrate thereby forming a second pattern having a pitch of p/2.

7. The method of claim 6, further comprising:

removing the lower layer of each of the plurality of "T"-shaped structures and removing the hard mask material.

8. The method of claim 6, wherein the lower layer of each of the plurality of "T"-shaped structures comprises one or more of an anti-reflective coating and a nitride on the substrate.

9. The method of claim 6, wherein the top layer of each of the plurality of "T"-shaped structures comprises one or more of a polymer and a photoresist over the lower layer.

10. A method for self-aligned spatial frequency doubling of a two dimensional pattern comprising:

a. forming a film stack over a substrate, wherein the film stack comprises a photoresist layer;

b. forming a one-dimensional periodic first pattern having a first pitch p on the photoresist layer using an optical exposure, wherein pitch p is at least smaller than twice the bandpass limit for optical exposures;

c. forming a second pattern using the first pattern by non-linear processing steps, wherein the second pattern has a second pitch $p_2=p/2$;

repeating the steps a-c to form a third pattern at an angle to the first pattern, wherein the third pattern has a pitch $p_3$ of about p/2.

11. The method of claim 10, further comprising transferring the second pattern of pitch $p_2$ and the third pattern of pitch $p_3$ into the film stack.

12. The method of claim 10, further comprising transferring the second pattern of pitch $p_1$ and the third pattern of pitch $p_3$ into the substrate.

* * * * *